United States Patent [19]

Piotto et al.

[11] Patent Number: 5,475,308

[45] Date of Patent: Dec. 12, 1995

[54] PROCESS FOR THE EXCITATION AND ACQUISTION OF NUCLEAR MAGNETIC RESONANCE SIGNALS, PARTICULARLY IN LIGHT WATER

[75] Inventors: Martial Piotto, Wissembourg, France; Vladimir Sklenar, Brno, Czechoslovakia; Vladimir Saudek, Strasbourg, France

[73] Assignee: Sadis Bruker Spectrospin Societe Anonyme De Diffusion De L'Instrumentation Scientifique Bruker Spectrospin, Wissembourg, France

[21] Appl. No.: 152,024

[22] Filed: Nov. 15, 1993

[30] Foreign Application Priority Data

Nov. 13, 1992 [FR] France ................................ 92 13825

[51] Int. Cl.⁶ .................................................. G01R 33/46
[52] U.S. Cl. ............................................. 324/307; 324/309
[58] Field of Search ............................... 324/300, 307, 324/309, 318, 322; 128/653.2, 653.5

[56] References Cited

U.S. PATENT DOCUMENTS

| | | | |
|---|---|---|---|
| 4,081,742 | 3/1978 | Hofer et al. | 324/307 |
| 4,728,889 | 3/1988 | Gadian et al. | 324/311 |
| 4,771,242 | 9/1988 | Lampman et al. | 324/309 |
| 4,912,050 | 3/1990 | Fossel | 324/307 |
| 4,947,119 | 8/1990 | Ugurbil et al. | 324/307 |
| 5,034,693 | 7/1991 | McKinnon et al. | 324/309 |
| 5,111,143 | 5/1992 | McKinnon et al. | 324/309 |
| 5,204,626 | 4/1993 | Onodera et al. | 324/309 |
| 5,221,899 | 6/1993 | Gonen et al. | 324/309 |
| 5,247,255 | 9/1993 | McKinnon et al. | 324/309 |
| 5,355,086 | 10/1994 | Ratzel | 324/309 |

FOREIGN PATENT DOCUMENTS

| | | |
|---|---|---|
| 0370333 | 5/1990 | European Pat. Off. . |
| 0460929 | 12/1991 | European Pat. Off. . |
| 0467467 | 1/1992 | European Pat. Off. . |

OTHER PUBLICATIONS

Ad Bax et al, "Optimized Recording of Heteronuclear Multi-dimensional NMR Spectra Using Pulsed Field Gradients", *Journal of Magnetic Resonance,* vol. 99, No. 3, Oct. 1, 1992, Orlando, Minn., pp. 638–643.

Jean-Max Tyburn, "Coherence Selection in Gradient-Enhanced, Heteronuclear Correlation Spectroscopy", *Journal of Magnetic Resonance,* vol. 97, No. 2, Apr. 1, 1992, Orlando, Minn., pp. 305–312.

Chrit T. W. Moonen et al., "Gradient-Enchanced Exchange Spectroscopy", *Journal of Magnetic Resonance,* vol. 97, No. 2, Apr. 1, 1992, Orlando, Minn., pp. 419–425.

Boban K. John, "Effective Combination of Gradients and Crafted RF Pulses for Water Suppression in Biological Samples," *Journal of magnetic resonance,* vol. 98, No. 1, Jun. 1, 1992, Orlando, Minn., pp. 200–206.

Primary Examiner—Sandra L. O'Shea
Assistant Examiner—Raymond Y. Mah
Attorney, Agent, or Firm—Young & Thompson

[57] ABSTRACT

Process for the excitation and acquisition of NMR signals, particularly for the analysis of molecules dispersed in a solvent, such as for example water. A specimen to be analyzed is first subjected to a series of impulses (1) corresponding to a high resolution NMR test to be carried out. Then there is applied to the specimen a first pulsed field gradient (2)in a given direction, and then the specimen is subjected to a 180° selective pulsed radiofrequency field (3) affecting all the spectrum except the resonance frequency of the water or corresponding solvent. Then a second pulsed field gradient (4) identical to the first is applied to the specimen. Then the acquisition and processing of the resulting NMR signals are effected.

10 Claims, 8 Drawing Sheets

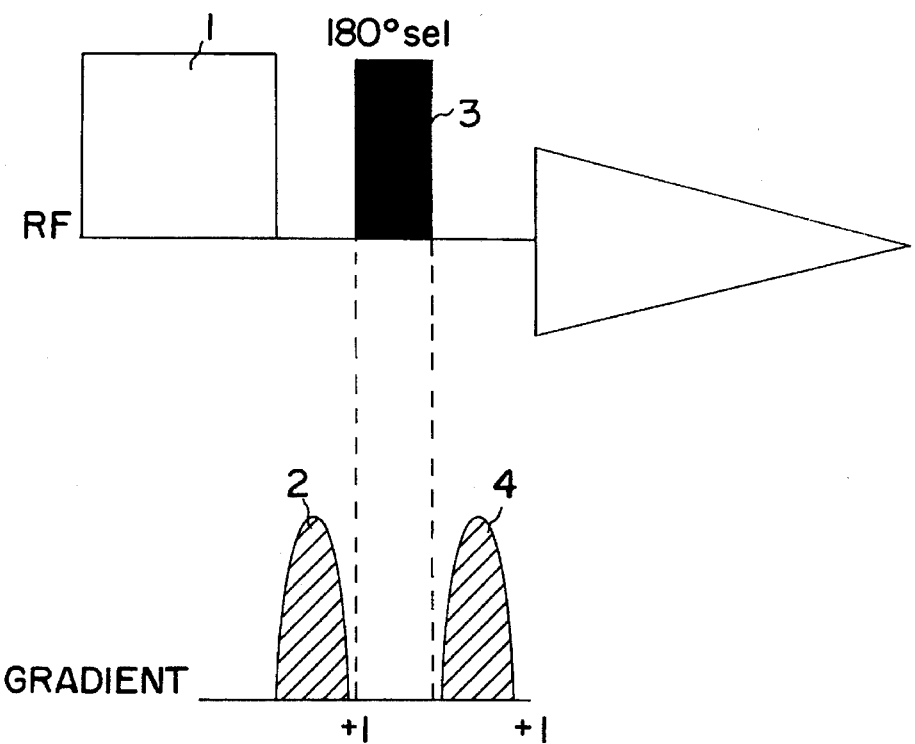
F I G. 1A
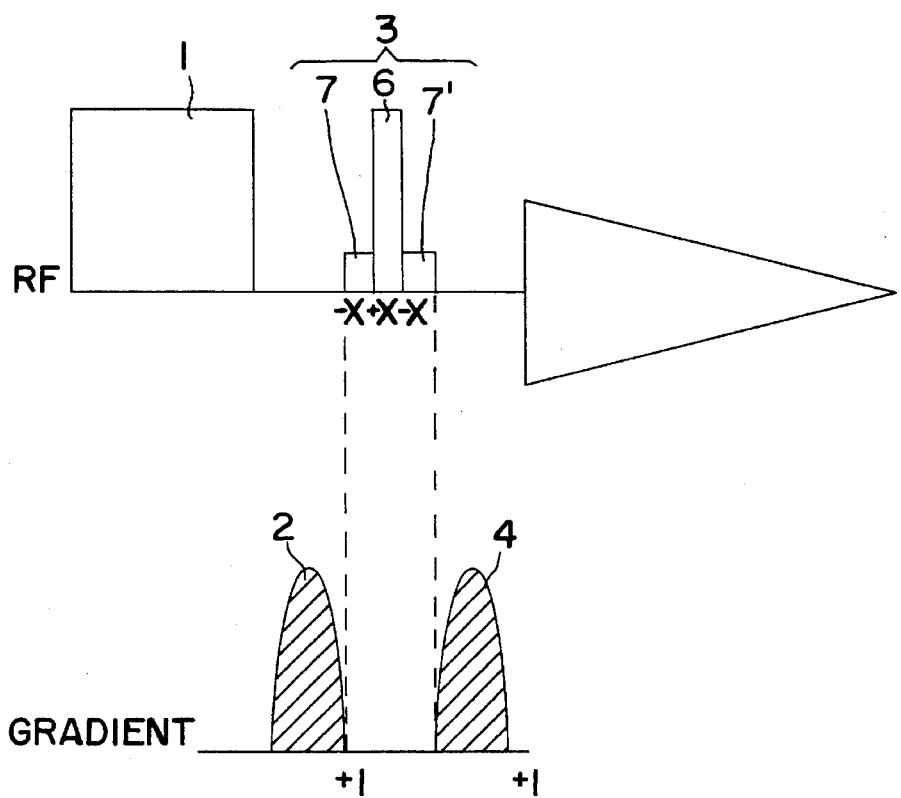
F I G. 1B

PROCESS FOR THE EXCITATION AND ACQUISTION OF NUCLEAR MAGNETIC RESONANCE SIGNALS, PARTICULARLY IN LIGHT WATER

BACKGROUND OF THE INVENTION

1. Field of the Invention

The present invention relates to the field of processes and techniques connected with the application of Nuclear Magnetic Resonance (NMR), particularly for high resolution tests, and has for its object a process for the excitation and acquisition of NMR signals, particularly in light water.

2. Description of the Related Art

Multidimensional NMR has become an essential instrument for the study of molecules in solution, particularly biomolecules, and serves as a good alternative to x-ray crystallography.

Thus, it is now possible to obtain protein structures up to 30–40 kD (kilo Dalton) by using a combination of NMR tests in two dimensions, three dimensions and four dimensions (see particularly G. Marius Clore and Angela M. Gronenborn, "Progress in NMR Spectroscopy", 23, 43–1991).

A crucial step for the determination of these structures is attribution of the signals of all the protons of the molecule to be analyzed and, in particular, the protons in exchange with those of water or of the corresponding solvent.

Because these protons are exchanged with water, the study of these molecules must be effected in a solution having a proportion of at least 90% water or of corresponding solvent.

Under these conditions, the proton concentration in the water is 110 M (mols) while the concentration of the solute (molecules to be analyzed) is about 2 mM (millimols).

Important difficulties result for the observation of the signals which are about 55,000 times smaller (weaker) than the strongest signal, namely, that corresponding to the water protons or those of the solvent used.

Another disadvantageous result of this high concentration of solvent is the appearance of a phenomenon known by the name "Radiation Damping" (attenuation of radiation), which further upsets the observation of the spins that are of interest for the test.

So as to overcome these problems, the most conventional solution and the one most frequently used is the presaturation of the resonance of the water.

Nevertheless, for proteins in neutral or basic pH, this solution leads to an important attenuation of the resonances of the amide proteins and for the nucleic acids, with a total disappearance of the imine and amide protein signals.

This drawback can be avoided by using impulse sequences which do not perturb the population of the spins of the water during the relaxation times.

The different processes and methods of this type known at present can be classed in three distinct categories.

A first category of methods and processes uses selective excitation sequences such as impulsion of detection of the signal, such as particularly the process known by the name "jump and return", described by P. Plateau and M. Guéron in J. Am. Chem. Soc., 104, 7310 (1982) or also the process known under the name "11—echo" described by V. Sklenar and A. Bax in J. Magn. Reson., 74, 469 (1987).

The different processes and methods under the second category propose dephasing the transverse component of the magnetization of the water by a non-homogeneous radiofrequency field by means of locking the spins (see B. A. Masserie, G. Wider, G. Wider, G. Otting, C. Weber and K. Wuthrich, J. Magn. Reson., 85, 608–1989).

Finally, the processes and methods of the third category use technologies recently developed in the field of pulsed field gradient applications (see particularly G. W. Vuister, R. Boelens, R. Kaptein, R. E. Hurd, B. John, and P. C. M. Ziji, J. Am. Chem. Soc., 113, 9688, 1991).

Nevertheless, these three categories of known processes and methods mentioned above have numerous drawbacks in common, and also specific drawbacks.

Their principal common drawback resides in the fact that the suppression or attenuation of the solvent signal, particularly of water, is weak if a single transient is registered and that good attenuation of the signal corresponding to the solvent or to the water can be obtained only after the achievement of a complete phase cycle.

Moreover, the use of these known processes and methods recited above is limited to certain circumstances and experimental conditions.

Thus, the process "jump and return" can be practiced for NMR tests of a size or type known by the name NOESY (Nuclear Overhauser Effect Spectroscopy), but is very ineffective in association with NMR tests of the type known by the name TOCSY (Totally Correlated Spectroscopy) and ROESY (Rotating Overhauser Effect Spectroscopy) and is not in practice used for heteronuclear NMR tests.

The process using a spin locking impulse gives relatively good results for NMR tests of the types known by the names HMQC (Heteronuclear Multiple Quantum Coherence) and HSQC (Heteronuclear Single Quantum Coherence), but is difficult to use for homonuclear tests.

Finally, the processes and methods using pulsed field gradient techniques are not effective, for the suppression of the water peak, except in the framework of NMR tests of the heteronuclear type and have no utility in the framework of tests of the NOESY, TOCSY and ROESY type.

Moreover, use of these latter processes and methods gives rise to a decrease by half of the signal/noise ratio.

SUMMARY OF THE INVENTION

The present invention has in particular for its object to overcome all of the above difficulties.

To this end, it has for its object a process for the excitation and acquisition of NMR signals, particularly for the analysis of molecules dispersed in a solvent, such as for example water, characterized in that it consists essentially in subjecting at the outset the sample to be analyzed to a series of impulses corresponding to the high resolution NMR test to be carried out, then applying to it a first pulsed field gradient in a given direction, subjecting it then to a 180° selective pulsed radiofrequency field, affecting all the spectrum except the resonance frequency of the water or corresponding solvent, applying to it a second pulsed field gradient, identical to the first, and, finally, effecting the acquisition and processing of the resulting NMR signals.

BRIEF DESCRIPTION OF THE DRAWINGS

The invention will be better understood from the following description, which relates to preferred embodiments, given by way of non-limiting example, and explained with reference to the accompanying schematic drawings, in which:

FIG. 1A is a schematic diagram showing the course of the process according to the present invention in the general case, FIG. 1B is a schematic diagram showing the course of the process according to the invention, according to a first particular embodiment.

DETAILED DESCRIPTION OF THE INVENTION

Figure 2A:
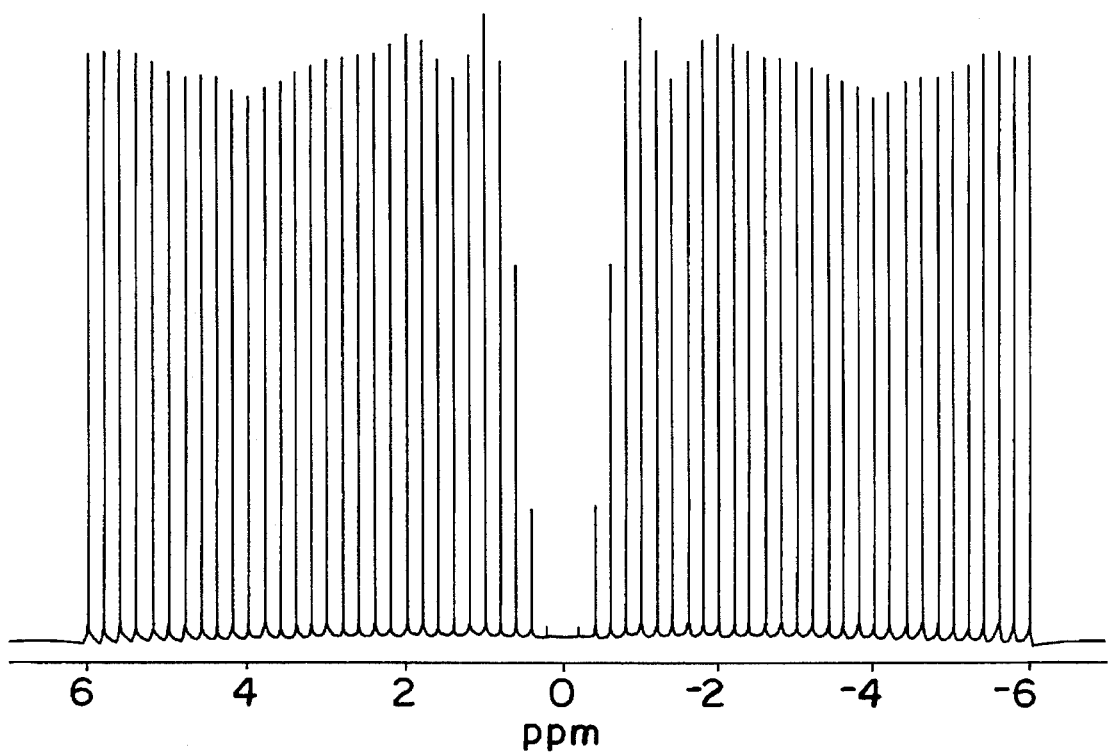
FIG. 2A is a spectrum diagram showing the excitation profile generated by the 180° selective pulsed radiofrequency field, obtained by using the first particular embodiment of the invention shown in FIG. 1B.

According to the invention, as shown particularly in FIGS. 1, 3A, 4 to 7 and 8A of the accompanying drawings, the process for excitation and acquisition of NMR signals consists essentially in subjecting first the specimen to be analyzed to a series of impulses 1 corresponding to the high resolution NMR test to be carried out, then applying to it a first pulsed field gradient 2 in a given direction, for example the direction Z, then subjecting it to a 180° selective pulsed radiofrequency 3, affecting all the spectrum except the resonance frequency of water, applying to it a second pulsed field gradient 4, identical to the first, and, finally, effecting the acquisition and processing of the resulting NMR signals.

The 180° selective pulsed radiofrequency field 3 is accordingly applied selectively to the protons to be analyzed in the framework of the NMR test carried out, but does not affect the resonance of the solvent, for example preferably water.

Thus, all the coherences dephased by the first pulsed field gradient 2 are rephased by the second pulsed field gradient 4, on the condition that they are subjected to a rotation of 180°, which is to say that they will be affected by the 180° selective pulsed radiofrequency field 3.

In the present text, the term "selective" means a field or an impulse affecting all of the spectrum, except the resonance frequency of water or of the corresponding solvent, and the term "unselective" designates a field or an impulse affecting all the spectrum with no exception.

Figure 2B:
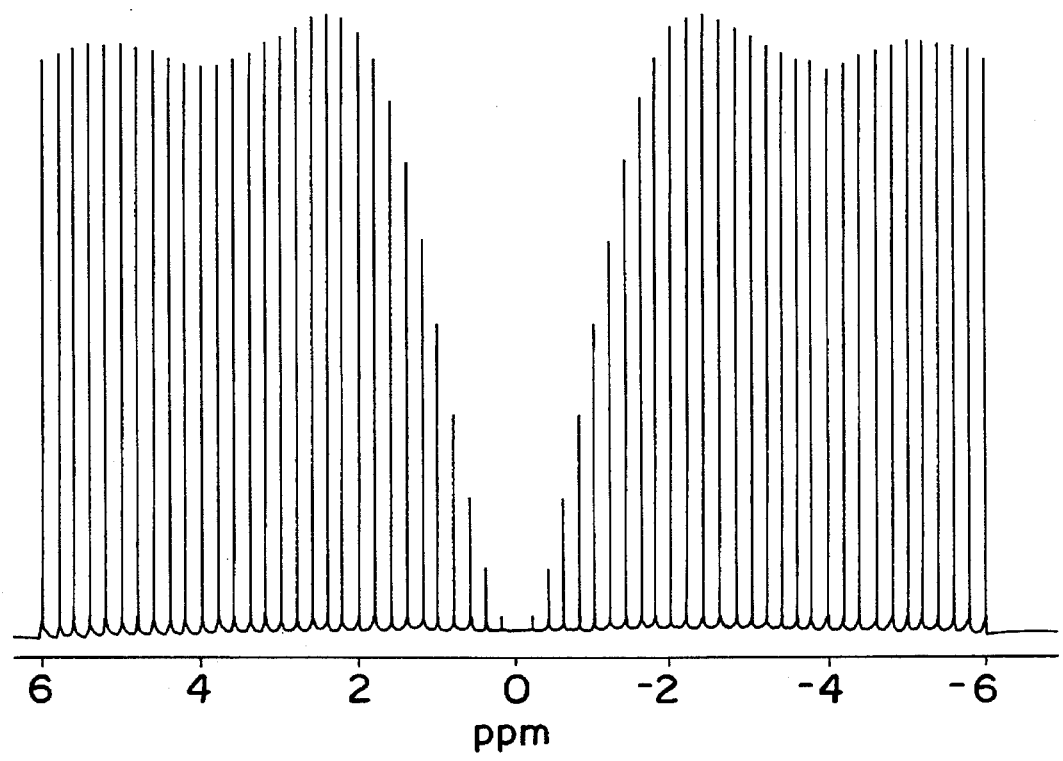
FIG. 2B is a spectrum diagram showing the excitation profile generated by the 180° selective pulsed radiofrequency field, obtained by using a second particular embodiment of the invention.

Preferably, the spectral diagram of the excitation profile has intensity variations less than 10% in the excited spectrum and an unexcited spectral band, about the resonance frequency of the solvent, of a width less than 1000 Hz, preferably less than 500 Hz, at 50% intensity and with a proton resonance frequency of 500 MHz (see FIGS. 2A and 2B).

As shown in FIGS. 1, 3A, 4 to 7 and 8A of the accompanying drawings, the pulsed field gradients 2 and 4 and the 180° selective pulsed radiofrequency field 3 are used immediately after achievement of the sequence of impulses corresponding to the NMR test to be carried out.

Figure 7:
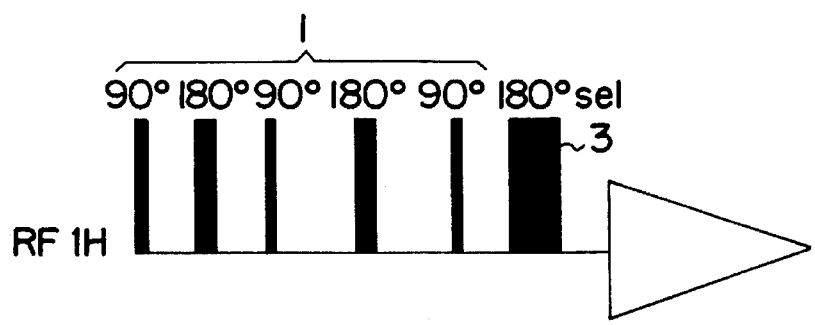
Figure 7:
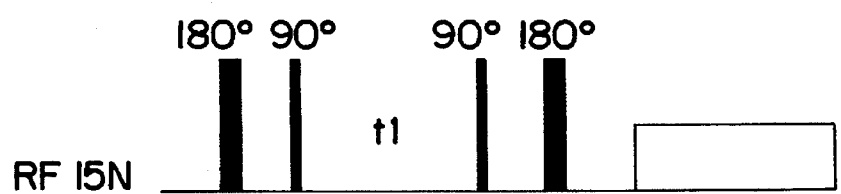
Figure 7:

For the particular case of a test of the HSQC type, the field gradients 2 and 4 and the use of the radiofrequency field 3 are inserted in the refocalization period of the so-called inverted INEPT step (Insensitive Nuclei Enhanced by Polarization Transfer). It is desirable, in this case, to take into consideration the duration of the field gradients 2 and 4 and of the radiofrequency field 3 during adjustment of the refocalization delay (FIG. 7).

According to a first characteristic of the invention, shown also in FIGS. 1,3A, 4 to 7 and 8A of the accompanying drawings, the two pulsed field gradients 2 and 4 have preferably impulse envelopes of sinusoidal shape, permitting suppressing or attenuating the signals corresponding to ,water or the solvent used, to a degree such that their intensity will become comparable to that of the signals of the protons to be analyzed in the framework of the test carried out.

Nevertheless, other shapes of envelopes are also envisageable such as for example envelopes of the square or Gaussian or Lorentzian type.

The total time between the end of the NMR test performed, and the beginning of acquisition of the resulting NMR signals, is less than 6 milliseconds, having regard for the duration of the overlap of the gradients of about 125 microseconds.

According to a first embodiment of the invention, the 180° selective pulsed radiofrequency field 3 can be constituted by three successive components, namely, a 180° unselective radiofrequency impulse 6 oriented in a given direction X, and two 90° selective radiofrequency impulses 7 and 7', identical to each other, of low power, of which one 7 precedes and the other 7' follows the 180° unselective radiofrequency impulse 6, and which are oriented in a direction –X opposite the direction X of this latter (FIG. 1B).

The 90° selective radiofrequency impulses 7 and 7' can thus consist in a preferred embodiment either of rectangular impulses, or of impulses modulated in amplitude such that the variations of amplitude adapted to be introduced into the excitation profile will be eliminated (FIG. 2A).

In the case in which 90° selective rectangular radiofrequency impulses 7 and 7' of low power are used, the width of the unexcited region is delimited by the length of said 90° selective impulses 7 and 7' (length T) while the width of the excitation band is principally limited by the intensity of the radiofrequency field of the 180° unselective impulse 6.

According to a first approximation, the spectrum domain having reduced intensities is limited to the multiple frequencies of 1/T beginning with the frequency of the carrier centered on the corresponding spectrum position at the resonance peak of water.

The variation of amplitude introduced by the two 90° selective rectangular impulses 7 and 7' is less than 10% and can be suppressed by modulating the envelopes of these impulses 7 and 7'.

According to a second embodiment of the invention, the 180° selective pulsed radiofrequency field 3 is constituted by a series of successive impulses of high power corresponding to a sequence of the type:

3a-T-9a-T-19a-T-19a-T-9a-T-3a, with 26a=180° and T corresponding to the delay between two successive impulses.

This sequence of impulses of high power can be obtained by optimization by means of a simulation in a computer and has optimum refocalization properties. By way of example, the excitation profile of this sequence of impulses is represented in FIG. 2B (with a carrier frequency −500 MHz, T=250 microseconds and field power=19,230 Hz).

The sequence of impulses of high power can have, for example, the following respective phases (0, 0, 0, 180, 180, 180) for its different successive components, permitting delivering a train of impulses effecting a non-excitation at the carrier frequency and at frequencies offset by +/− k/T with k=0, 1, 2, 3 . . .

Nevertheless, the sequence of high power impulses could also have respective phases (0, 180, 0, 0, 180, 0) for its different successive components, permitting the suppression of the spectrum peak of the resonance of water or of the corresponding solvent at frequencies offset by +/− (2k+1)/2T relative to the carrier frequency.

The two impulse sequences described above generate spectra comprised by pure phase signals and effecting an important suppression or attenuation of the peak corresponding to water or the corresponding solvent, with an attenuation factor of the order of $10^4$ to $10^5$, during a single scan.

This desirable property of the invention arises from the fact that, in the framework of a single scan, the effect of the two pulsed field gradients 2 and 4 preceding and following the 180° selective radiofrequency impulse 3, is essentially equivalent to the use of a four-step phase cycle known by the name EXORCYCLE and described in "Journal of Magnetic Resonance", 27, 511–514, 1977 by Geoffrey Bodenhausen, Ray Freeman and David L. Turner.

The pulsed field gradient 4 immediately preceding the acquisition phase ensures practically complete elimination of the spectral peak corresponding to water or to the solvent used, and permits the use of very high receiver gains.

Moreover, and contrary to the different processes and methods known to the prior art, the process of excitation and acquisition according to the invention can be used in association with most of the high resolution NMR tests, particularly those mentioned at the beginning of the present text.

Figure 8A:
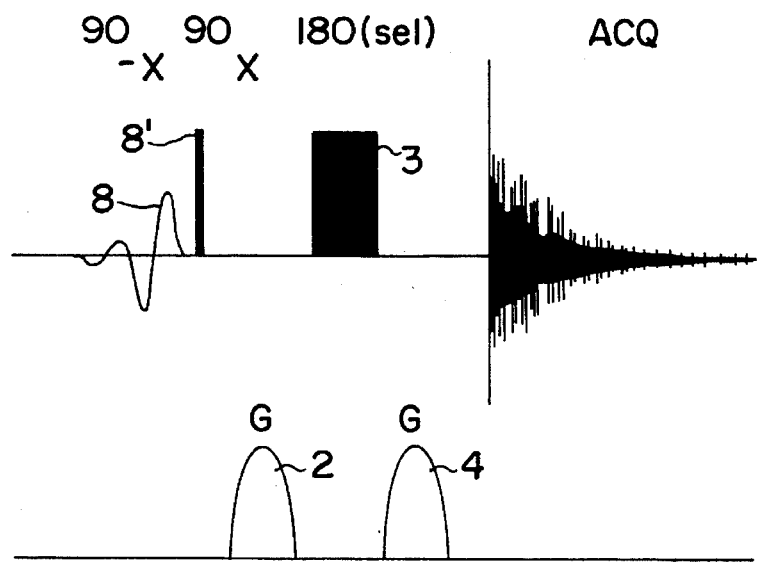
FIG. 8A is a schematic diagram showing the course of the process according to the invention practiced in the framework of an NMR test of the type 1D (single dimensional), according to a modified embodiment.

According to a modified embodiment of the invention, shown in FIG. 8A of the accompanying drawings, the process of excitation and acquisition consists preferably, before emission of the series of impulses 1 corresponding to the high resolution NMR test to be carried out, in subjecting the specimen to a 90° selective radiofrequency impulse 8, having a carrier frequency identical to the resonance frequency of the solvent, for example water, such that the magnetization of the solvent returns to its equilibrium position under the influence of a second 90° unselective radiofrequency impulse 8'.

FIG. 8A shows the use of this supplemental arrangement of the invention in the framework of an NMR test 1D. Nevertheless, it is also possible to use this arrangement in association with other NMR tests, particularly of the type 2D.

This supplemental arrangement of the invention permits, when the relaxation delay is substantially of the same value as the relaxation time T1 of water or the corresponding solvent, avoiding a partial saturation of the resonance of the water or of the corresponding solvent, and therefore a saturation and a modification of the signals of the protons exchanged with the water or the solvent, these undesirable effects being if desired also able to be transferred, by means of the spin diffusion of the unexchanged protons, with water or the corresponding solvent.

Figure 3A:
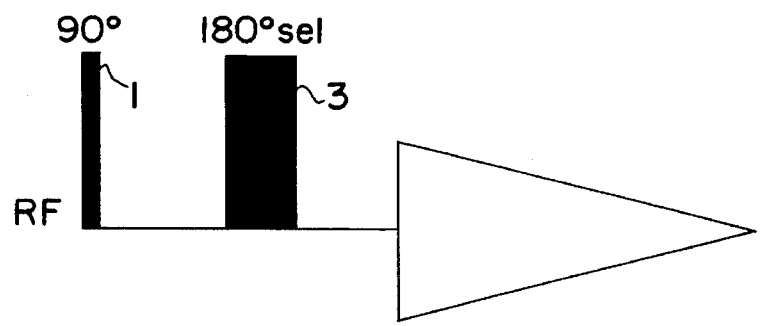
FIG. 3A is a schematic diagram showing the course of the process according to the invention used in the framework of an NMR test of the type 1D (single dimensional)
Figure 3A:
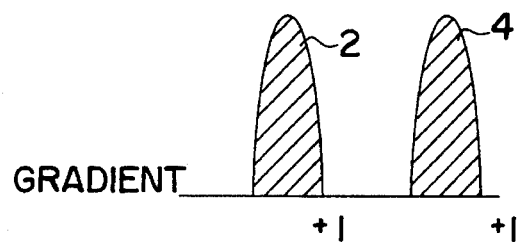
Figure 3B:
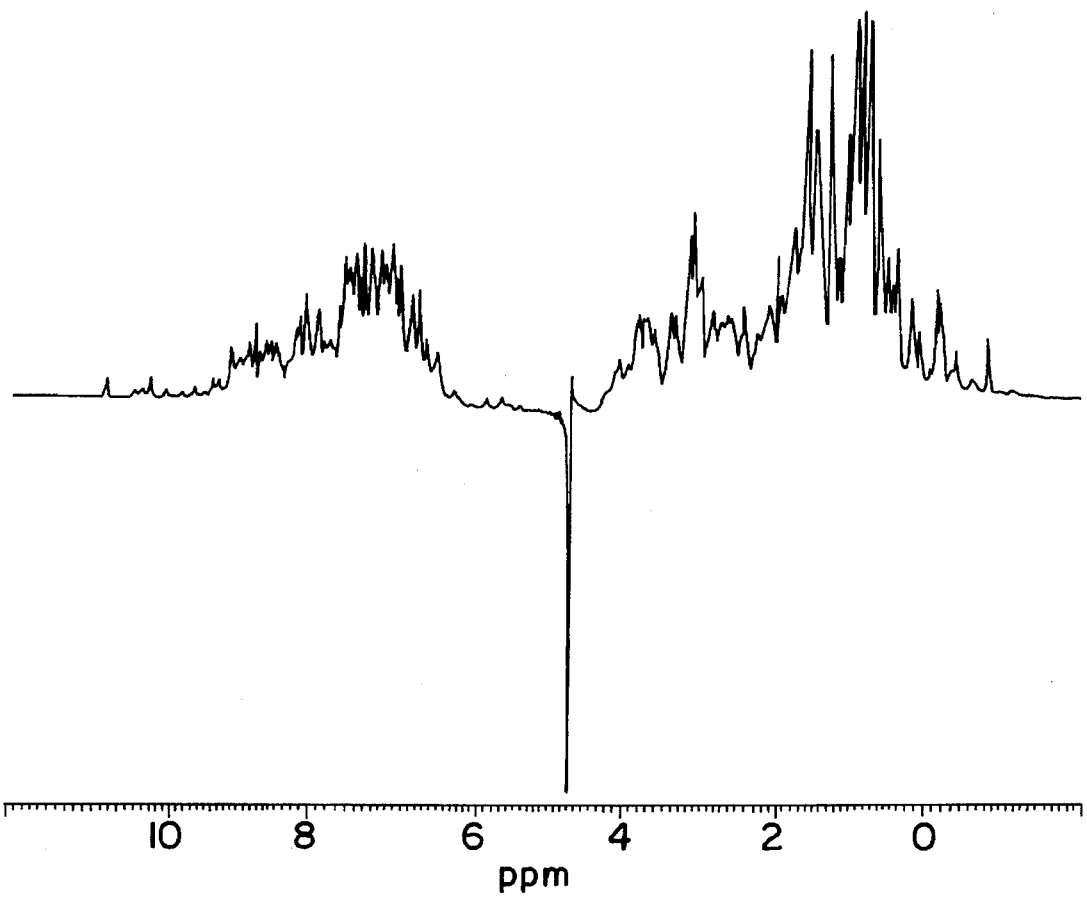
FIG. 3B shows the NMR spectrum resulting after practice of an NMR test of the type shown in FIG. 3A, FIGS. 4 to 7 are schematic diagrams showing the course of the process according to the invention practiced in the framework of different NMR tests, respectively of the types NOESY, TOCSY, ROESY and HSQC.
Figure 4:
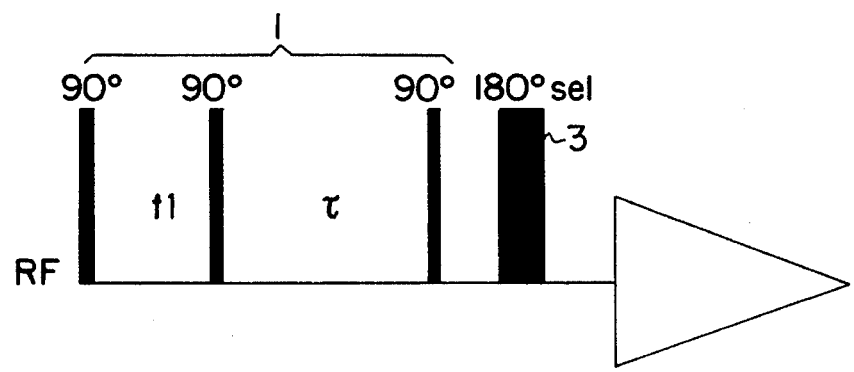
Figure 4:
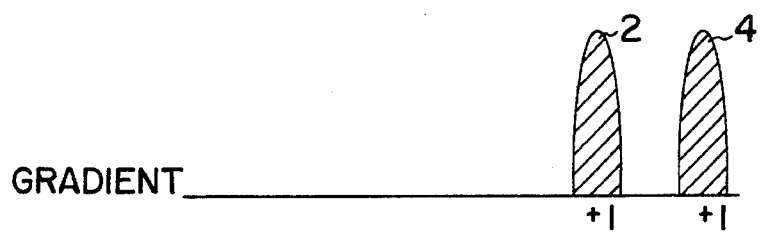
Figure 5:
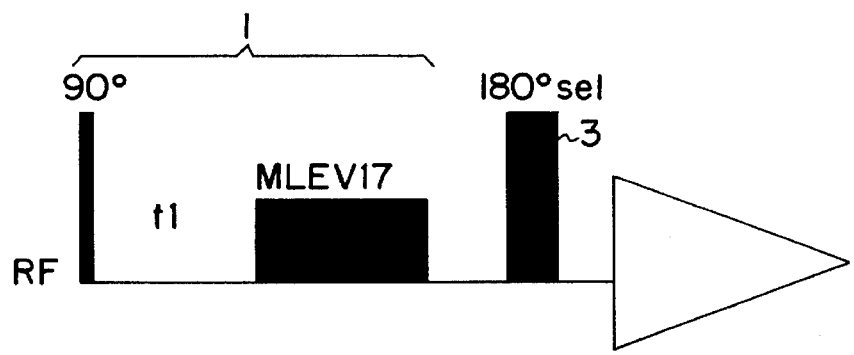
Figure 5:
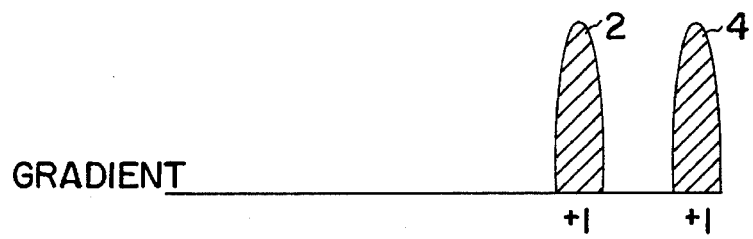
Figure 6:
Figure 6:
Figure 8B:
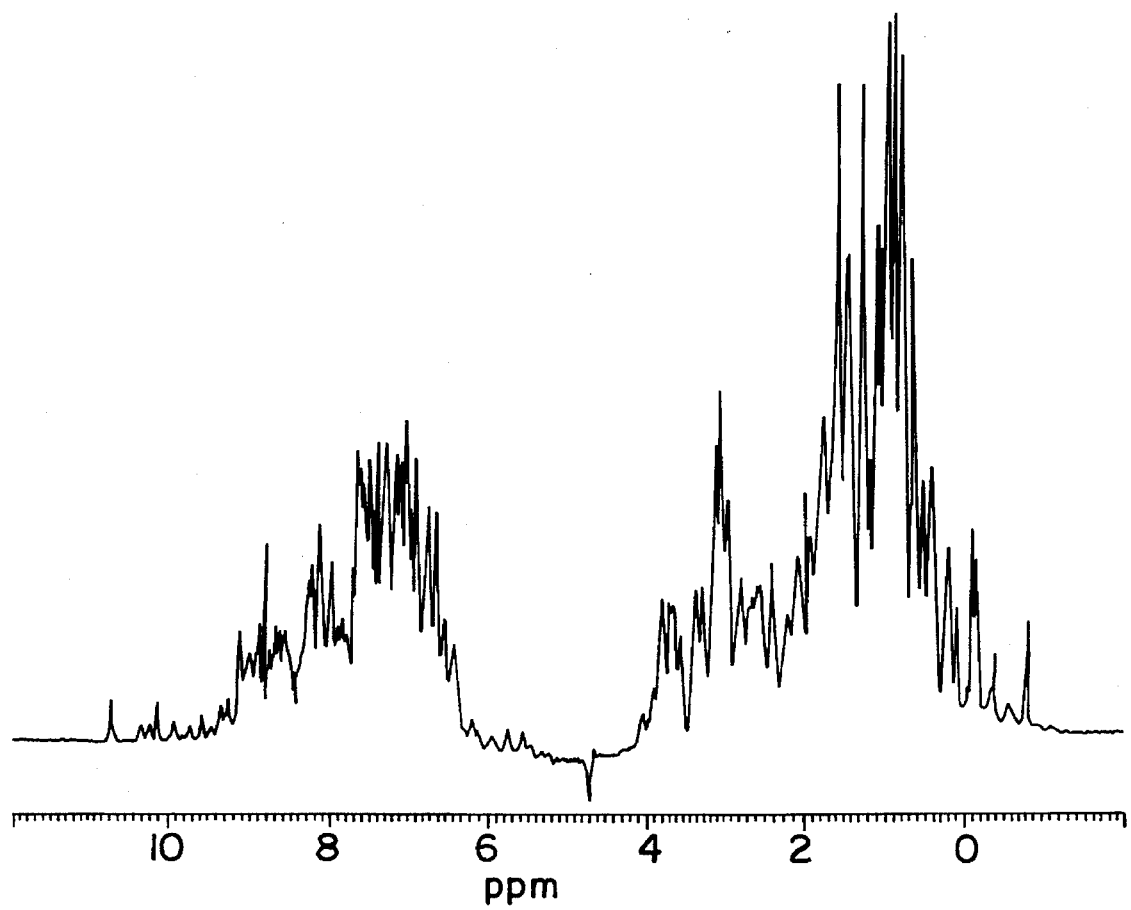
FIG. 8B shows the NMR spectrum resulting after practice of the test shown in FIG. 8A, effected under the same conditions as those pertaining to the spectrum shown in FIG. 3B and, FIGS. 9A and 9B are NMR spectra resulting from the framework of the tests of the NOESY and TOCSY type, with use of the process according to the invention.
Figure 9A:
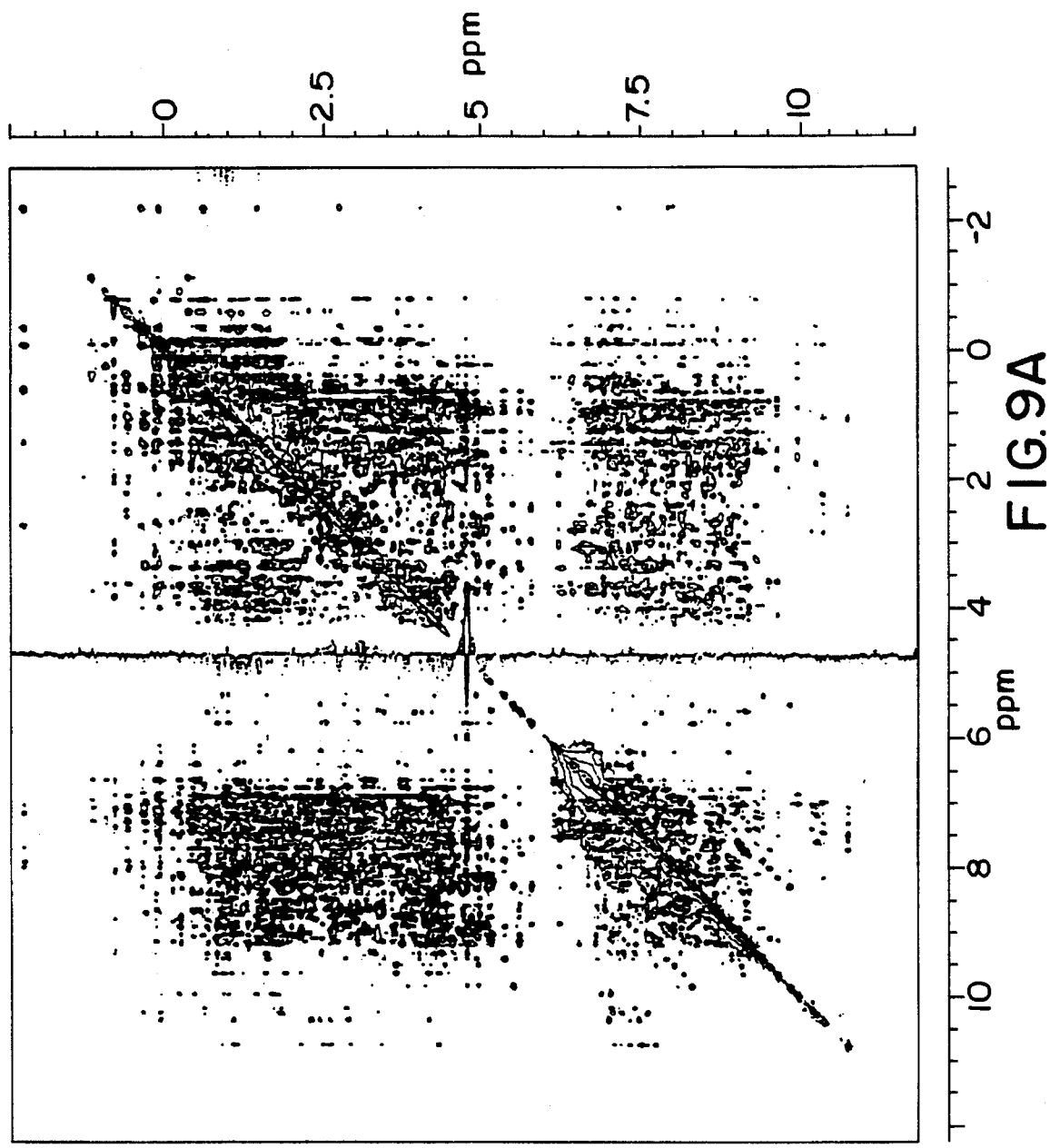
Figure 9B:
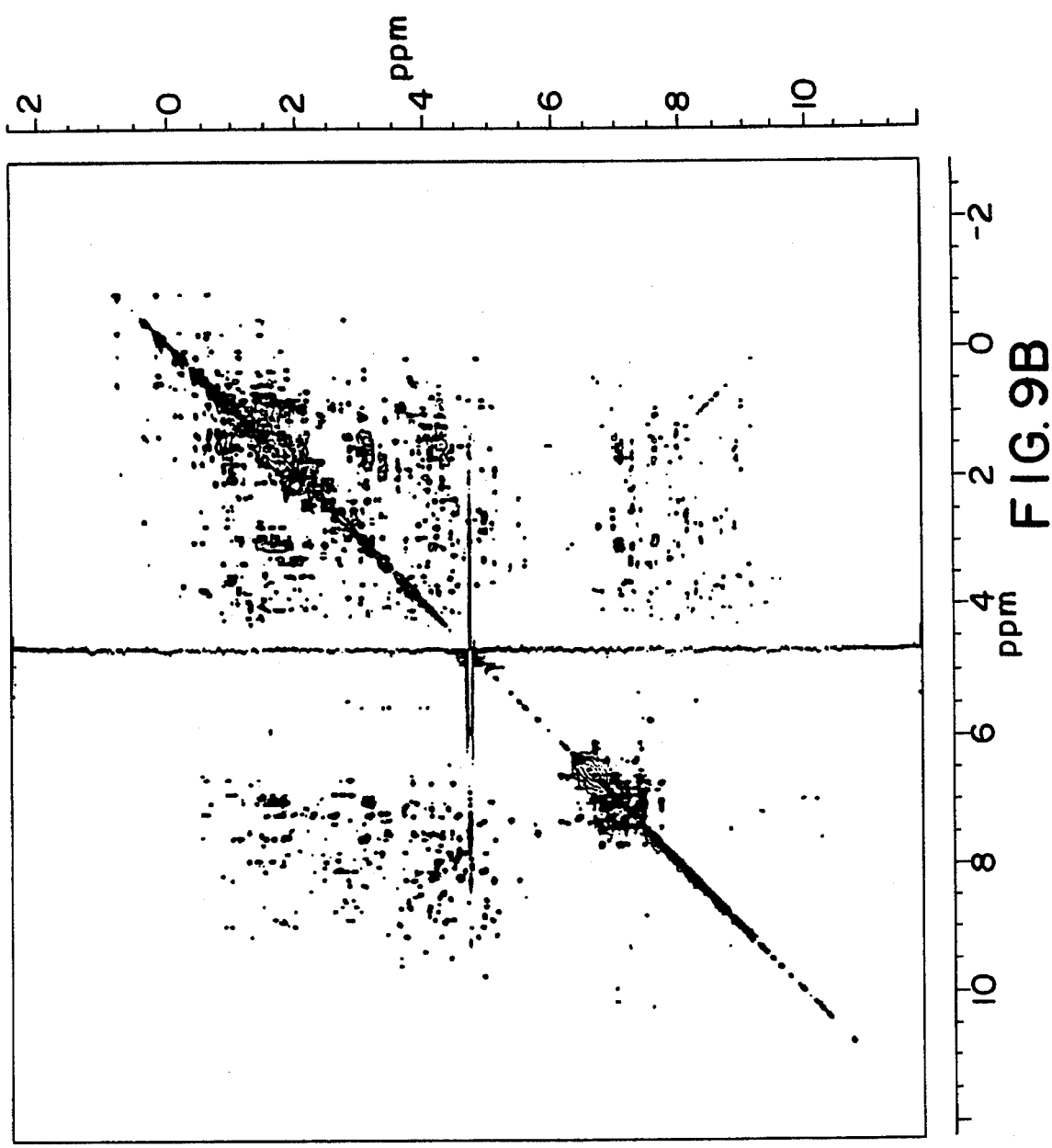

The beneficial effect of this supplemental arrangement of the invention can easily be seen by comparing the NMR spectra represented in FIGS. 3B and 8B.

The 90° selective impulse 8 which is used can, for example, consist in an impulse of the type known by the name EBURP 2 (Excitation Band selective Uniform Response Pure phase) and described particularly in "Journal of Magnetic Resonance", 93, 93–141, 1991 by Helen Geen and Ray Freeman. Such an impulse 8 permits carrying out a narrow band excitation of the molecules of water or the corresponding solvent, with a uniform phase over the excitation band width and negligible disturbance in the other remaining spectral fields.

The process of excitation and acquisition according to the present invention described above in connection with NMR tests with one dimension or two dimensions can of course also be practiced in association with or in the framework of three dimensional or four dimensional NMR tests.

Of course, the invention is not limited to the embodiments described and shown in the accompanying drawings. Modifications remain possible, particularly as to the construction of the various elements or by substitution of technical equivalents, without thereby departing from the scope of protection of the invention.

What is claimed is:

1. Process for the excitation and acquisition of high resolution NMR signals, for the analysis of molecules dispersed in a solvent, comprising the steps of:

subjecting a specimen to be analyzed to a series of impulses (1) corresponding to a high resolution NMR test to be carried out, applying to the specimen a first pulsed field gradient (2) in a given direction, subjecting the specimen to a 180° selective pulsed radiofrequency field (3) affecting all the spectrum except the resonance frequency of the solvent, an excitation profile of said 180° selective pulsed radiofrequency field (3) varying in intensity by less than 10% in an excited spectrum; and applying to the specimen a second pulsed field gradient (4) identical to the first and then effecting the acquisition and processing of the resulting NMR signals.

2. Process according to claim 1, wherein the two pulsed field gradients (2 and 4) have impulse envelopes of sinusoidal shape.

3. Process according to claim 1, wherein the 180° selective pulsed radiofrequency field (3) is constituted by three successive components, namely, a 180° unselective radiofrequency impulse (6) oriented in a given direction (X), and two identical 90° selective radiofrequency impulses (7 and 7') of low power, of which one (7) precedes and the other (7') follows the 180° unselective radiofrequency impulse (6), said two impulses being oriented in a direction (−X) opposite said given direction (X).

4. Process according to claim 3, wherein the 90° selective radiofrequency impulses (7 and 7') comprise one of rectangular impulses and amplitude modulated impulses.

5. Process according to claim 1, wherein the 180° selective pulsed radiofrequency field (3) is constituted by a sequence of successive impulses of high power corresponding to a sequence of the type:

3a-T-9a-T-19a-T-19a-T-9a-T-3a, wherein 26a=180°.

6. Process according to claim 5, wherein the sequence of impulses of high power has the respective phases (0, 0, 0, 180, 180, 180) for its different successive components.

7. Process according to claim 5, wherein the sequence of impulses of high power has the respective phases (0, 180, 0, 0, 180, 0) for its different successive components.

8. Process according to claim 1, wherein, before emission of the sequence of impulses (1) corresponding to the high resolution NMR test to be carried out, the specimen is subjected to a 90° selective radiofrequency impulse (8), at the resonance frequency of the solvent, such that the magnetization of the solvent returns to its equilibrium position under the influence of a second 90° unselective radiofrequency impulse (8').

9. Process according to claim 8, wherein the 90° selective pulsed radiofrequency field (8) which is applied consists in an impulse of the EBURP 2 type.

10. Process according to claim 1, wherein the solvent is water.

* * * * *

UNITED STATES PATENT AND TRADEMARK OFFICE
CERTIFICATE OF CORRECTION

PATENT NO. : 5,475,308
DATED : December 12, 1995
INVENTOR(S) : Martial PIOTTO et al.

It is certified that error appears in the above-identified patent and that said Letters Patent is hereby corrected as shown below:

On the title page, in Item [54], change "ACQUISTION" to --ACQUISITION--.

Column 1, line 2, change "ACQUISTION" to --ACQUISITION--.

Signed and Sealed this

Twenty-sixth Day of March, 1996

Attest:

BRUCE LEHMAN

*Attesting Officer*   *Commissioner of Patents and Trademarks*